(12) United States Patent
Mao et al.

(10) Patent No.: US 10,667,434 B1
(45) Date of Patent: May 26, 2020

(54) LIQUID IMMERSION COOLING DEVICE

(71) Applicant: HONGFUJIN PRECISION ELECTRONICS (TIANJIN) CO., LTD., Tianjin (CN)

(72) Inventors: Tze-Chern Mao, New Taipei (TW); Li-Wen Chang, New Taipei (TW); Chao-Ke Wei, New Taipei (TW); Yao-Ting Chang, New Taipei (TW); Chih-Hung Chang, New Taipei (TW); Yen-Chun Fu, New Taipei (TW); Ching-Tang Liu, New Taipei (TW)

(73) Assignee: HONGFUJIN PRECISION ELECTRONICS (TIANJIN) CO., LTD., Tianjin (CN)

( * ) Notice: Subject to any disclaimer, the term of this patent is extended or adjusted under 35 U.S.C. 154(b) by 0 days.

(21) Appl. No.: 16/379,311

(22) Filed: Apr. 9, 2019

(30) Foreign Application Priority Data

Jan. 29, 2019 (CN) .......................... 2019 1 0087642

(51) Int. Cl.
*H05K 7/20* (2006.01)

(52) U.S. Cl.
CPC ..... *H05K 7/20645* (2013.01); *H05K 7/20236* (2013.01); *H05K 7/20263* (2013.01); *H05K 7/20272* (2013.01)

(58) Field of Classification Search
CPC combination set(s) only.
See application file for complete search history.

(56) References Cited

U.S. PATENT DOCUMENTS

| 5,253,320 | A | * | 10/1993 | Takahashi | G02B 6/3897 |
| | | | | | 385/135 |
| 5,836,786 | A | * | 11/1998 | Pepe | H01R 13/518 |
| | | | | | 439/557 |
| 9,655,281 | B2 | * | 5/2017 | Harvilchuck | F28F 9/0275 |
| 10,111,355 | B1 | * | 10/2018 | Marrs | H05K 7/14 |
| 10,499,528 | B2 | * | 12/2019 | Marrs | H05K 7/14 |
| 2005/0189855 | A1 | * | 9/2005 | Naue | A47B 88/43 |
| | | | | | 312/334.4 |
| 2009/0161312 | A1 | * | 6/2009 | Spearing | H05K 7/20727 |
| | | | | | 361/679.47 |

(Continued)

FOREIGN PATENT DOCUMENTS

TW 201633881 A 9/2016

*Primary Examiner* — Timothy J Thompson
*Assistant Examiner* — Krystal Robinson
(74) *Attorney, Agent, or Firm* — ScienBiziP, P.C.

(57) ABSTRACT

A liquid immersion cooling device includes a mounting frame, a liquid reservoir mounted to the mounting frame, and a cold source distributor mounted on an outer side of the mounting frame. The liquid reservoir is configured to immerse a server in an insulating coolant. The liquid reservoir is movably mounted to the mounting frame. The cold source distributor comprises a telescopic cold source tube and a telescopic heat return tube. An output end of the cold source tube and an output end of the heat return tube are coupled to the liquid reservoir. When the liquid reservoir is pulled out of the mounting frame, the cold source tube and the heat return tube are extended by the liquid reservoir to a predetermined length. When the liquid reservoir is pushed into the mounting frame, the cold source tube and the heat return tube are retracted.

18 Claims, 8 Drawing Sheets

(56) References Cited

U.S. PATENT DOCUMENTS

| | | | |
|---|---|---|---|
| 2009/0219701 A1* | 9/2009 | Wu | H05K 7/1494 361/727 |
| 2011/0096485 A1* | 4/2011 | Jian | G06F 1/181 361/679.4 |
| 2014/0111930 A1* | 4/2014 | Henderson | G06F 1/181 361/679.31 |
| 2015/0177797 A1* | 6/2015 | Butzer | G06F 1/26 713/300 |
| 2016/0120059 A1* | 4/2016 | Shedd | H05K 7/208 165/244 |
| 2017/0071072 A1* | 3/2017 | Adams | H05K 7/1489 |
| 2017/0094822 A1* | 3/2017 | Chen | G11B 33/128 |
| 2019/0327860 A1* | 10/2019 | Edwards | H05K 7/20809 |

* cited by examiner

LIQUID IMMERSION COOLING DEVICE

FIELD

The subject matter herein generally relates to a cooling device, and more particularly to a liquid immersion cooling device for cooling a server.

BACKGROUND

As server capabilities become more powerful, the ability to cool servers has become increasingly demanding. To address the large amount of heat generated by servers, the servers are generally immersed in non-conductive liquids for cooling. The existing cooling liquid is controlled by a valve, and when the server needs to be operated on, the flow of the cooling liquid is stopped through the valve. This causes the problem of unsatisfactory server cooling. Furthermore, a liquid tank used for storing the cooling liquid takes up a lot of space.

BRIEF DESCRIPTION OF THE DRAWINGS

Implementations of the present disclosure will now be described, by way of embodiments, with reference to the attached figures.

DETAILED DESCRIPTION

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

FIGS. 1-4 show an embodiment of a liquid immersion cooling device 100 for cooling a server 200.

The liquid immersion cooling device 100 includes a mounting frame 10, a liquid reservoir 20, and a cold source distributor 30. The liquid reservoir 20 is movably mounted to the mounting frame 10, and the cold source distributor 30 is mounted to an outer side of the mounting frame 10 and coupled to the liquid reservoir 20. The mounting frame 10 mounts the liquid reservoir 20 and the server 200 for cooling the server 200. The cold source distributor 30 is used for heat exchange of an insulating coolant (not shown) of the liquid reservoir 20.

Figure 1:
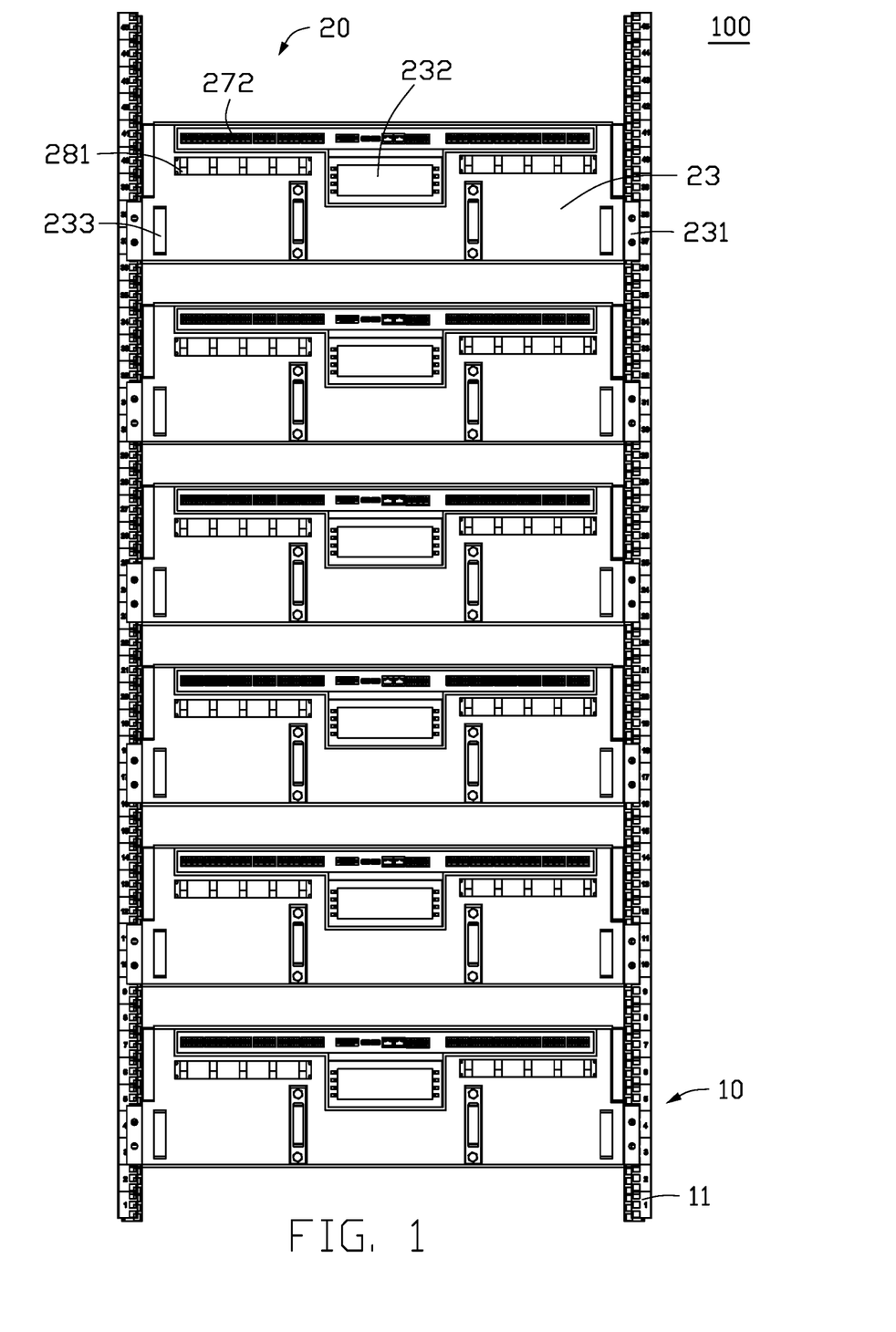
FIG. 1 is an assembled, schematic view of an embodiment of a liquid immersion cooling device.
Figure 2:
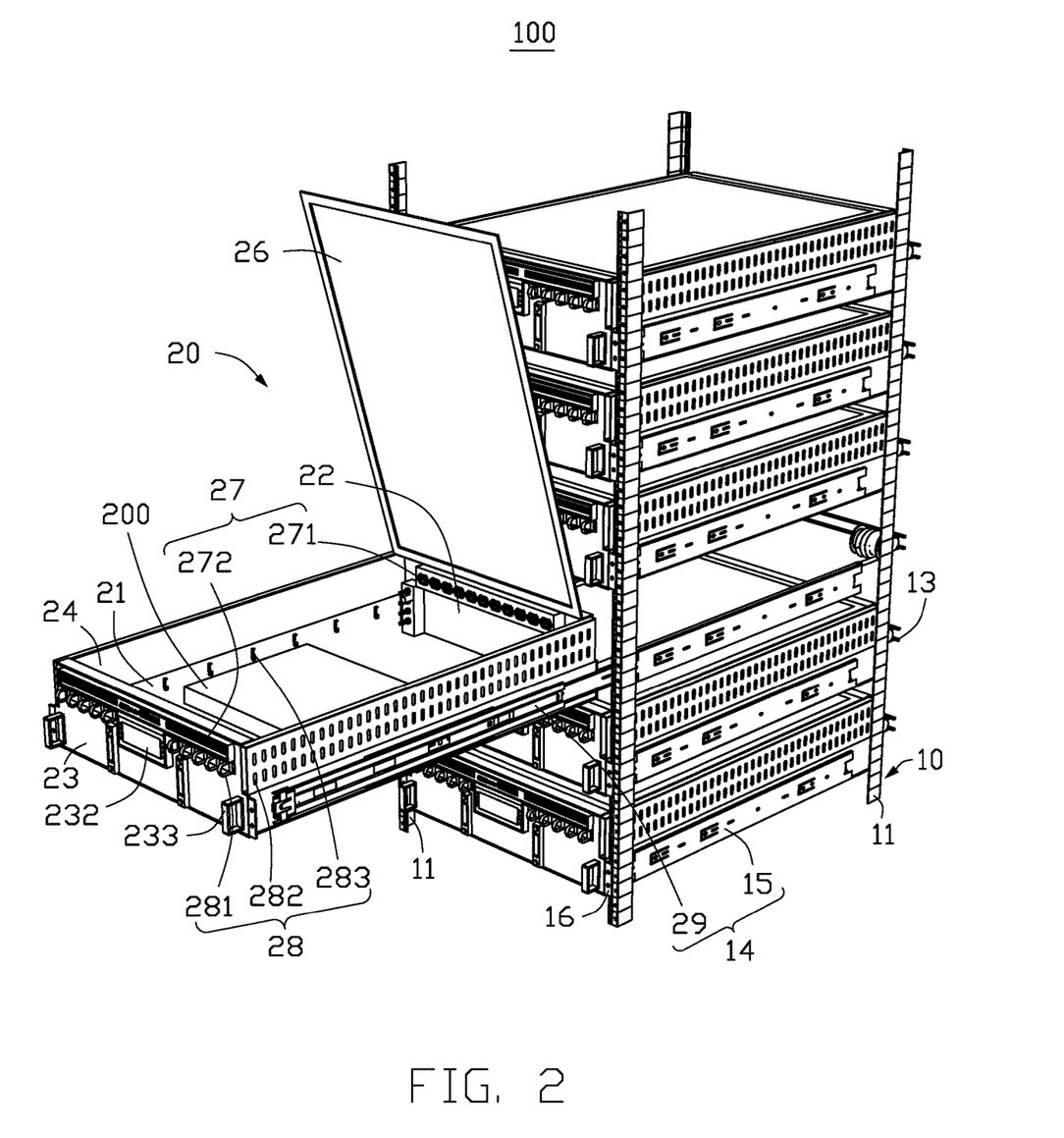
FIG. 2 is an isometric view of the liquid immersion cooling device in FIG. 1 showing a mounting frame pulled out.
Figure 3:
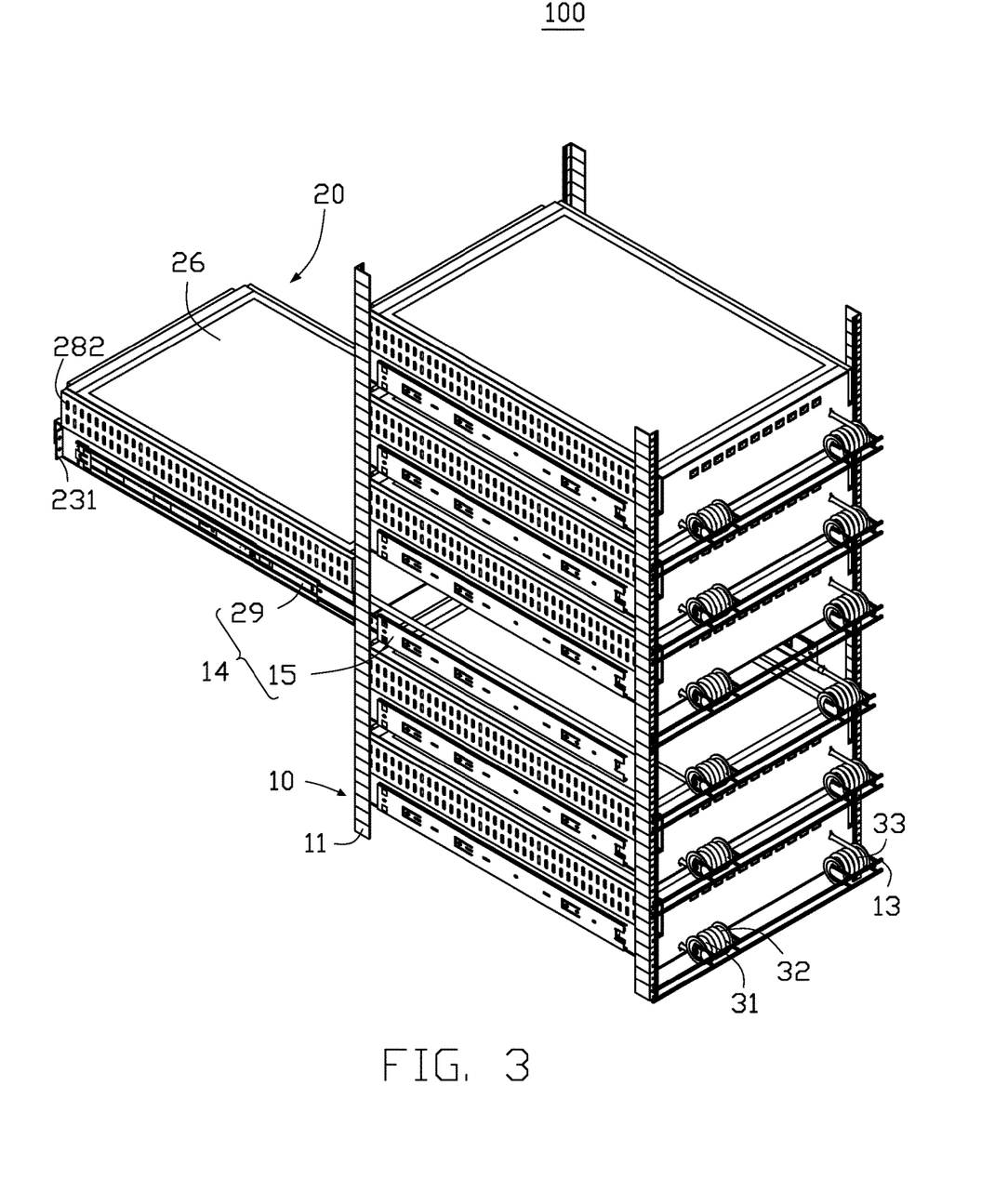
FIG. 3 is similar to FIG. 2, but showing the liquid immersion cooling device from another angle.
Figure 5:
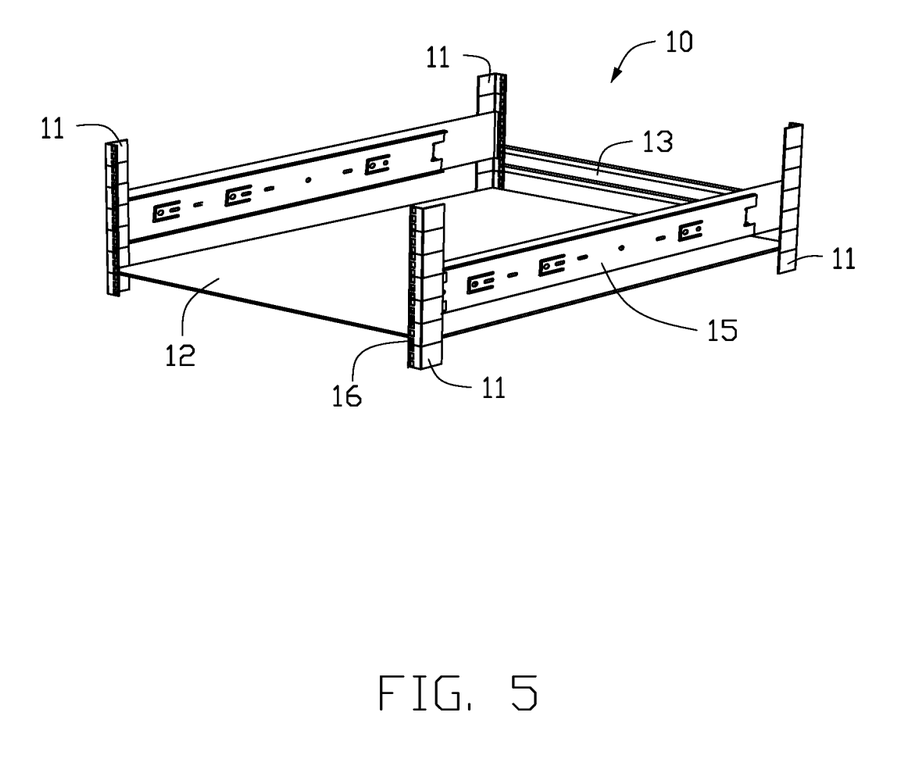
FIG. 5 is an isometric view of a mounting frame of the liquid immersion cooling device.

Referring to FIGS. 2 and 5, the mounting frame 10 is substantially rectangular cuboid and includes four legs 11 and a support plate 12. The support plate 12 is mounted within a space surrounded by the four legs 11 and used to support the liquid reservoir 20. A support rod 13 is mounted between two legs 11 along a width of the support plate 12, and a sliding rod 15 is coupled between two legs 11 along a length of the support plate 12 on opposite sides of the support plate 12. The sliding rod 15 is configured to move the liquid reservoir 20 within the mounting frame 10. The two legs 11 along a width of the support plate 12 opposite to the support rod 13 each include a protrusion 16 for engaging with the liquid reservoir 20 to mount the liquid reservoir 20 within the mounting frame 10. The liquid reservoir 20 is pushed into or pulled out of the mounting frame 10 along a lengthwise direction of the sliding rod 15.

Figure 6:
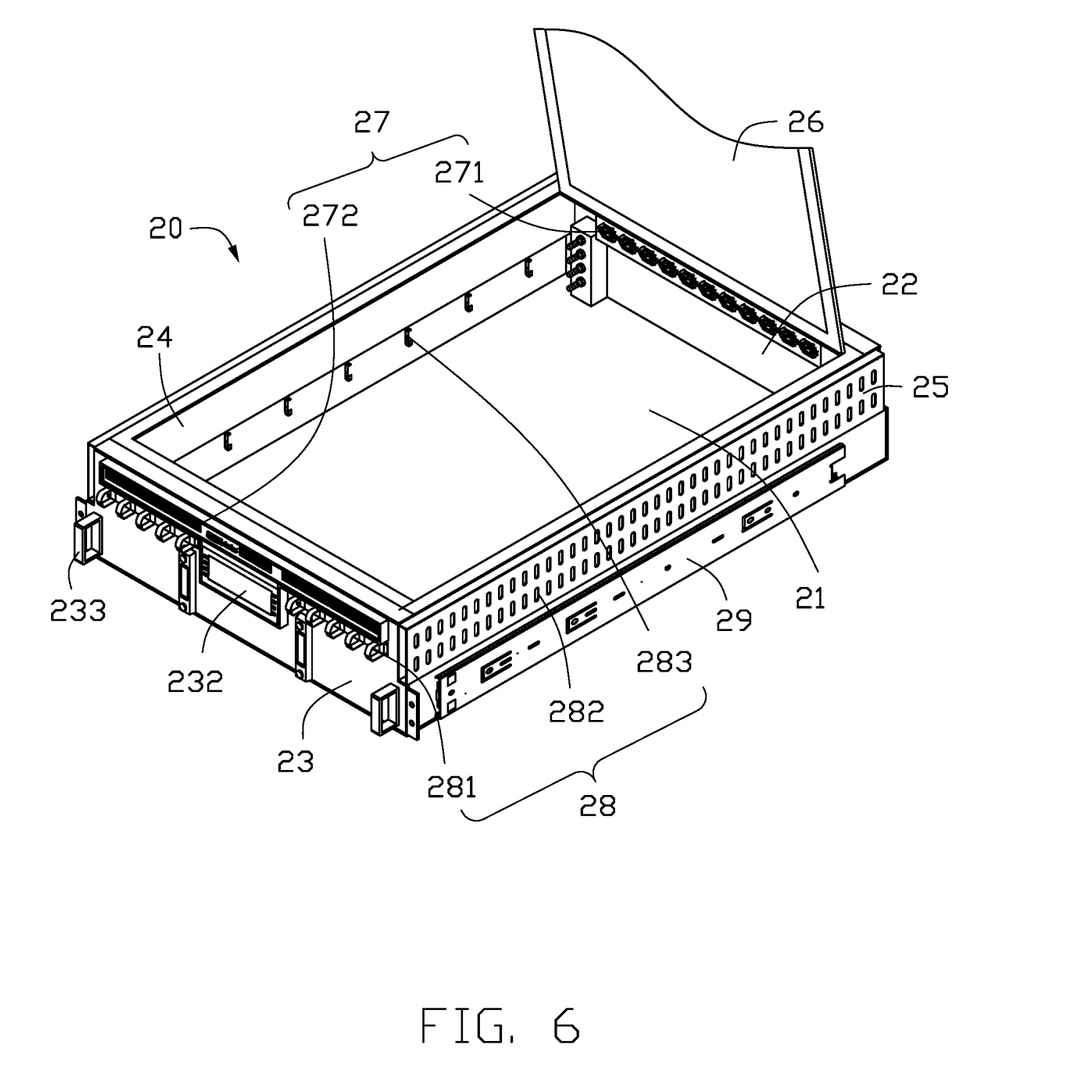
FIG. 6 is an isometric view of a liquid reservoir of the liquid immersion cooling device.
Figure 7:
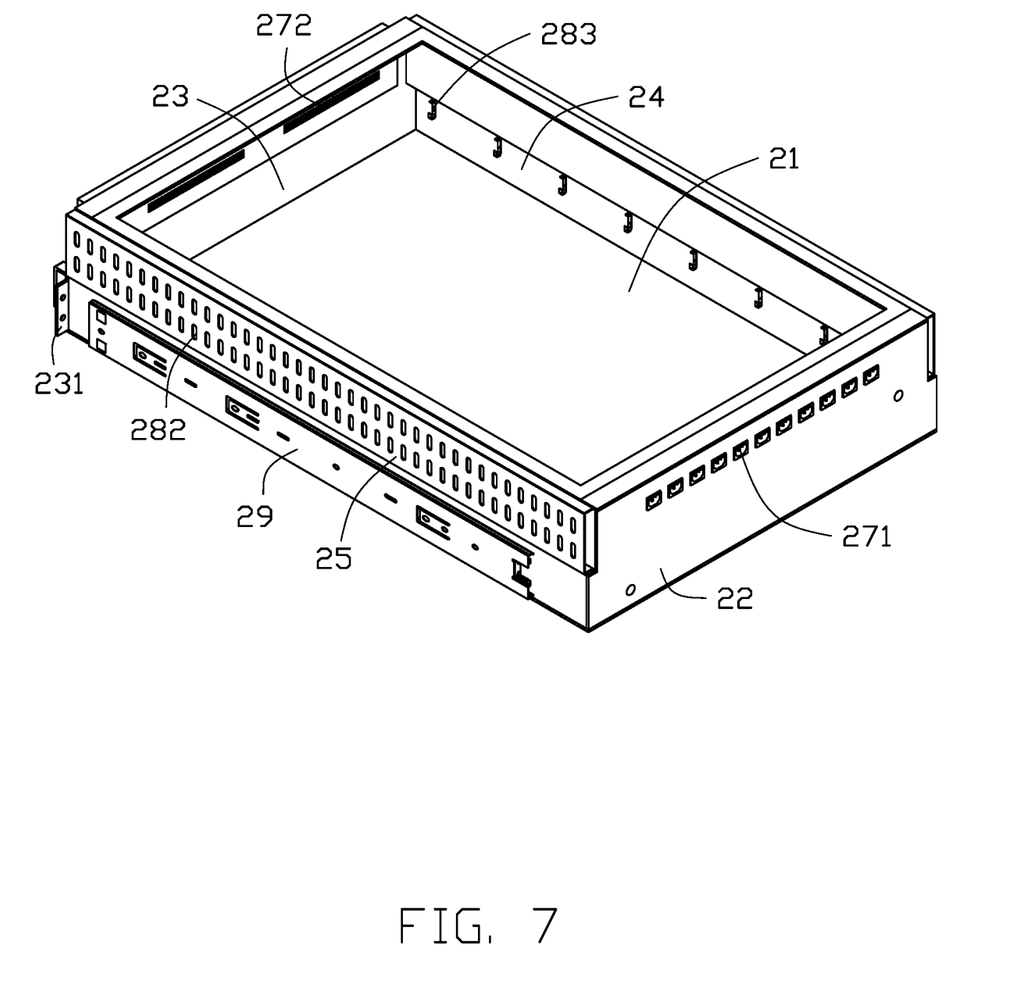
FIG. 7 is similar to FIG. 6, but showing the liquid reservoir from another angle.

Referring to FIG. 2, FIG. 6, and FIG. 7, the liquid reservoir 20 is substantially rectangular parallelepiped-shaped. The liquid reservoir 20 has a size corresponding to a size of a corresponding server 200. Thus, the server 200 can be placed in a corresponding liquid reservoir 20 according to the size of the server 200. The liquid reservoir 20 includes a base plate 21 and a first sidewall 22, a second sidewall 23, a third sidewall 24, and a fourth sidewall 25 surrounding the base plate 21. The first sidewall 22 and the second sidewall 23 are respectively disposed along two width sides of the base plate 21, and the third sidewall 24 and the fourth sidewall 25 are respectively disposed along two longitudinal sides of the base plate 21. A cover plate 26 is disposed facing the base plate 21. The cover plate 26 is rotationally coupled to the first sidewall 22 and engages with the second sidewall 23. Thus, the liquid reservoir 20 can be opened and maintained by rotating the cover plate 26. It can be understood that in another embodiment, the cover plate 26 can be disposed on the third sidewall 24 to be engaged with the fourth sidewall 25 to close the liquid reservoir 20.

The first sidewall 22 and the second sidewall 23 of the liquid reservoir 20 are provided with an adapter 27 for supplying power, a network, and the like to the server 200 in the liquid reservoir 20. Specifically, the first sidewall 22 is provided with a plurality of first adapters 271 extending through the first sidewall 22. In one embodiment, the first adapter 271 on an inner side of the first sidewall 22 is used to connect a power line of the server 200 in the liquid reservoir 20 to an external power line (not shown) on an outer side of the first sidewall 22 to provide power for the server 200.

Referring to FIG. 6 and FIG. 7, the second sidewall 23 is provided with a plurality of second adapters 272 extending through the second sidewalls 23. The second adapter 272 on an inner side of the second sidewall 23 is used to couple a network line of the server 200 in the liquid reservoir 20 to an external network line (not shown) on an outer side of the second sidewall 23. The server 200 inside the liquid reservoir 20 provides a network.

It can be understood that the first adapter 271 and the second adapter 272 are not limited thereto. In other embodiments, the first adapter 271 can be used to connect network lines inside and outside the liquid reservoir 20. The second adapter 272 can be used to connect power lines inside and outside the liquid reservoir 20 for providing network or power to the server 200. The adapter 27 can perform other transformations or replacements depending on the design requirements of the liquid reservoir 20. The adapter 27 can be disposed not only on the first sidewall 22 and the second sidewall 23, but also can be disposed elsewhere, such as on the third sidewall 24 or the fourth sidewall 25. Providing a first adapter 271 and a second adapter 272 on the first sidewall 22 and the second sidewall 23 allows the server 200 inside the liquid reservoir 20 to selectively receive power and a network connection without opening the cover 26, thereby avoiding reduction of the insulating coolant in the liquid reservoir 20 by opening the cover plate 26.

Further, a latching portion 231 is provided at two ends of the second sidewall 23 at a junction with the third sidewall 24 and the fourth sidewall 25. The latching portion 231 is configured to latch with the protruding portion 16 on the legs 11 of the mounting frame 10 when the liquid reservoir 20 is mounted inside the mounting frame 10. It can be understood that the manner in which the liquid reservoir 20 is mounted to the mounting frame 10 is not limited to the above implementation.

Referring to FIG. 6, a display screen 232 is disposed on an outer surface of the second sidewall 23, and the display screen 232 is substantially centrally located on the outer surface of the second sidewall 23. The display screen 232 is used to display an internal condition of the liquid reservoir 20, such as a state of the display server 200, a temperature of the insulating coolant in the liquid reservoir 20, a flow rate of the insulating coolant, and the like.

Referring to FIG. 6, a handle 233 is disposed on the outer surface of the second sidewall 23. The handle 233 is substantially rectangular in cross section. In one embodiment, the second sidewall 23 is provided with two handles 233 respectively disposed on the second sidewall 23 adjacent to the latching portions 231. The handle 233 is used to push the liquid reservoir 20 into the mounting frame 10 or to pull the liquid reservoir 20 out of the mounting frame 10. In other embodiments, the handle 233 may also be U-shaped or other cross-sectional-shaped to facilitate pushing or pulling of the liquid reservoir 20.

Referring to FIG. 6, the second sidewall 23, the third sidewall 24, and the fourth sidewall 25 are provided with a cable management component 28 for guiding and mounting wires on the liquid reservoir 20. Specifically, an outer surface of the second sidewall 23 is provided with a cable manager 281 disposed below the second adapter 272 and placed on opposite sides of the display screen 232.

Referring to FIG. 6 and FIG. 7, the outer surfaces of the third sidewall 24 and the fourth sidewall 25 are respectively provided with cable management slots 282 through which the wires pass through the third sidewall 24 and the fourth sidewall 25 to avoid wire clutter. A line hook 283 is further disposed on an inner surface of the third sidewall 24 and the fourth sidewall 25 for guiding and mounting the lines inside the liquid reservoir 20.

A sliding block 29 is disposed on the third sidewall 24 and the fourth sidewall 25. The liquid reservoir 20 is movably mounted to the mounting frame 10 by the sliding block 29 and the sliding groove 15. In order to facilitate maintenance of the liquid reservoir 20, the liquid reservoir 20 can be pulled out of the mounting frame 10. It other embodiments, the liquid reservoir 20 can be movably mounted to the mounting frame 10 by engagement of ball bearings in the sliding groove 15.

Figure 4:
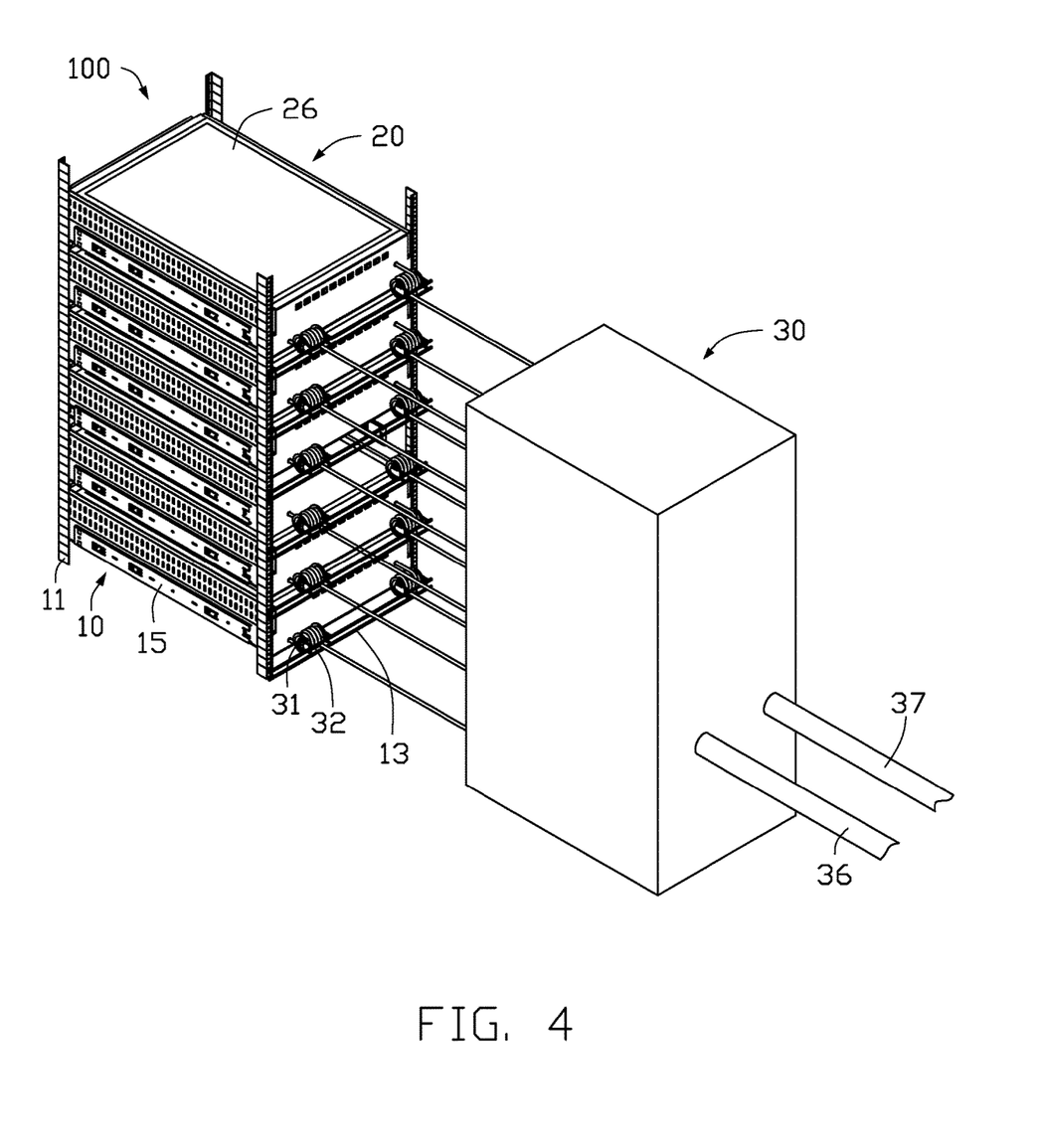
FIG. 4 is similar to FIG. 1, but showing the liquid immersion cooling device from another angle.

Referring to FIGS. 2 and 4, the cold source distributor 30 is mounted on a side of the mounting frame 10 adjacent to the support rod 13. The cold source distributor 30 includes a coiler 31, a cold source tube 32, and a heat return tube 33. Specifically, there are two coilers 31 rotationally mounted on the support rod 13. The cold source tube 32 and the heat return tube 33 are respectively wound around the two coilers 31 so that the cold source tube 32 and the heat return tube 33 can be extended and contracted. An output end of the cold source tube 32 and of the heat return tube 33 is coupled to the liquid reservoir 20. During movement of the liquid reservoir 20, the cold source tube 32 and the heat return tube 33 are extended or retracted. The cold source tube 32 is configured to supply the liquid reservoir 20 with a cold insulating coolant for cooling the server 200, and the heat return tube 33 is configured to supply the insulating coolant heated by the server 200 to the cold source distributor 30.

When the cold source tube 32 and the heat return tube 33 are extended with the liquid reservoir 20, the coiler 31 is rotated about the support rod 13 in a direction in which it is stretched. When the cold source tube 32 and the heat return tube 33 are retracted to the mounting frame 10 with the liquid reservoir 20, the coiler 31 is wound around the support rod 13 in an opposite direction.

Figure 8:
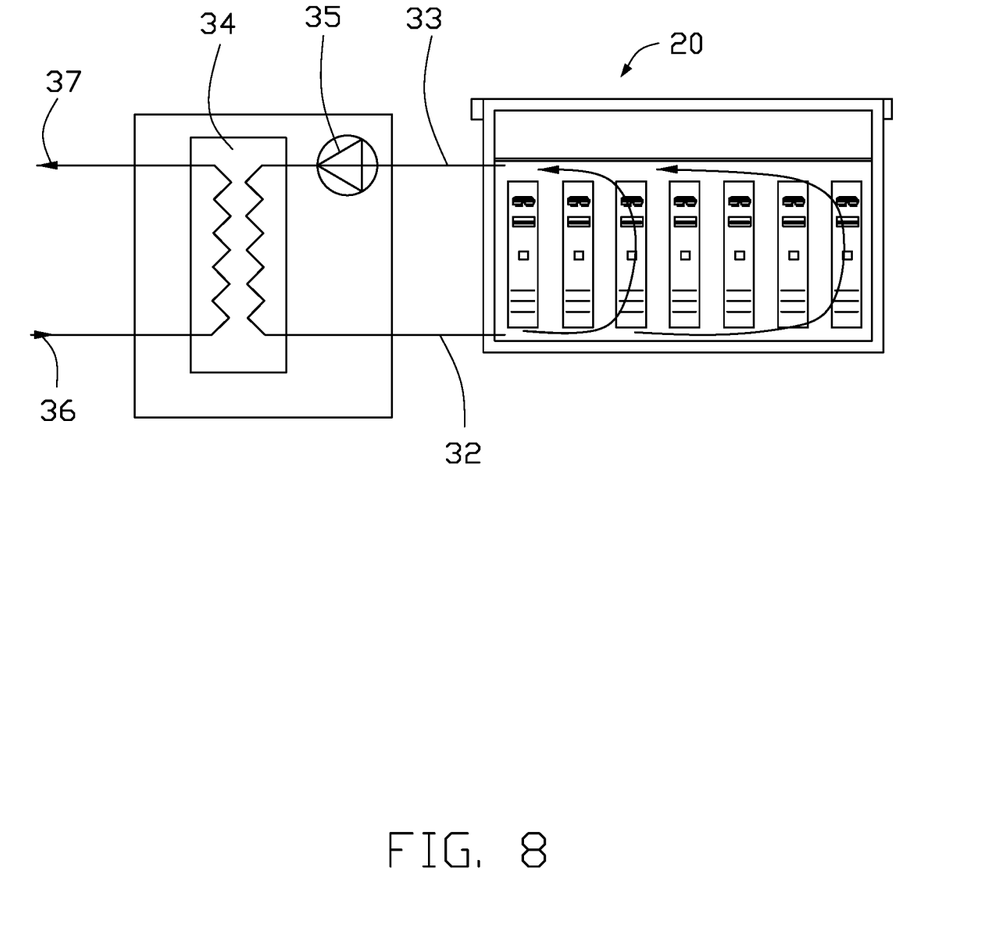
FIG. 8 is a schematic diagram showing operation of the liquid immersion cooling device.

Referring to FIG. 8, the cold source distributor 30 further includes a heat exchanger 34, a pump body 35, a cooling port 36, and a hot water circulating port 37. One side of the heat exchanger 34 is coupled to the cold source tube 32 and the heat return tube 33, and the other side of the heat exchanger 34 is coupled to the cooling port 36 and the hot water circulating port 37. The pump body 35 is coupled between the heat return tube 33 and the heat exchanger 34. Specifically, in the cold source distributor 30, cooling water in the cooling port 36 is sent to the heat exchanger 34, and the insulating coolant is cooled and then sent to the liquid reservoir 20 through the cold source tube 32. After the cooled insulating coolant absorbs the heat of the server 200, the hot insulating coolant is discharged from the heat return tube 33 to the heat exchanger 34 through the pump body 35. After the heated insulating coolant is heat-exchanged with the cooling water supplied from the cooling port 36, the insulating coolant is sent to the liquid reservoir 20 through the cold source tube 32. The cooling water after heat exchange with the hot insulating coolant is then heated from the cold source distributor 30 through the hot water circulating port 37. The heated water output from the cold source distributor 30 can continue to be used without causing contamination of the water.

Referring to FIG. 1, FIG. 2, FIG. 3, FIG. 4, and FIG. 8, in one embodiment, a plurality of mounting frames 10 each mounted with a corresponding liquid reservoir 20 is stacked in a multi-layer stacking space of the liquid immersion cooling device 100. A plurality of the liquid reservoirs 20 stacked may also be divided according to a type of the servers 200. Some of the plurality of liquid reservoirs 20 stacked may be planned as a server for calculation or planned as a server for data storage. Further, other functions may be divided according to the type of the servers 200. Due to the different sizes of the different types of servers 200, the liquid reservoirs 20 can be changed according to the size of the servers 200, such that the liquid reservoirs 20 can receive the servers 200 of the same size. Thus, the insulating coolant is prevented from stagnating within the liquid reservoir 20 due to lack of flow, insulation is increased, and the amount of coolant required to be filled is reduced.

The liquid reservoirs 20 are stacked and connected to the cold source distributor 30, and an insulating coolant is transported into the liquid reservoirs 20 to dissipate heat from the servers 200. The server 200 is powered by a first adapter 271, and the server 200 is provided with a network by the second adapter 272. The liquid reservoir 20 and its internal condition are known from the display screen 232, and the wires connected to the liquid reservoir 20 and the internal server 200 is fixed by the cable management member 28.

When a certain liquid reservoir 20 needs to be maintained, the handle 233 is pulled to pull the liquid reservoir 20 out of the mounting frame 10, and the cold source tube 32 and the heat return tube 33 are extended to a predetermined length while the cold source tube 32 and the heat return tube 33 maintain to dissipate heat from the server 200. The latching portion 231 is unlatched from the projection 16. The power and network are disconnected from the corresponding liquid reservoir 20, and the cover plate 26 is opened to perform maintenance on the server 200.

When the liquid reservoir 20 is pushed into the mounting frame 10, the cold source tube 32 and the heat return tube 33 are retracted. The liquid reservoir 20 is fastened by the projection 16 and the latching portion 231. The cold source distributor 30 continues to dissipate heat from the server 200 in the liquid reservoir 20.

In one embodiment, the cold source tubes 32 and the heat return tubes 33 connected to the liquid reservoirs 20 in which the servers 200 mounted therein have a power within a predetermined range may be connected to the same heat exchanger 34 in order to perform better heat dissipation of the servers 200 of different ranges of power.

In other embodiments, the support rod 13 can be disposed on the liquid reservoir 20, and the coiler 31 rotates the support rod 13 disposed on the liquid reservoir 20 to wind the cold source tube 32 and the heat return tube 33 on the coiler 31. An abutting member (not shown) may be disposed on the fixing frame 10 for telescopically abutting the cold source tube 32 and the heat return tube 33, thereby preventing the cold source tube 32 and the heat return tube 33 from coming in frictional contact with other portions of the mounting frame 10.

The liquid immersion cooling device 100 stacks a plurality of the liquid reservoirs 20, thereby improving utilization of an upper space. By separately placing the different servers 200, the heat dissipation efficiency of the liquid reservoir 20 on the server 200 is improved. The cold source distributor 30 is coupled to the liquid reservoir 20 through a cold source pipe 32 and a heat return pipe 33 to dissipate heat from the server 200, and is also capable of cooling the server 200 when the liquid reservoir 20 is pulled out.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A liquid immersion cooling device comprising:
   a mounting frame;
   at least one liquid reservoir movably mounted to the mounting frame and each configured to accommodate coolant therein with; and
   a cold source distributor mounted on an outer side of the mounting frame; wherein:
   the cold source distributor comprises a telescopic cold source tube and a telescopic heat return tube;
   an output end of the telescopic cold source tube and an output end of the telescopic heat return tube are coupled to each of the at least one liquid reservoir;
   when the at least one liquid reservoir is pulled out of the mounting frame, the telescopic cold source tube and the telescopic heat return tube are extended by the liquid reservoir to a predetermined length;
   when the at least one liquid reservoir is pushed into the mounting frame, the telescopic cold source tube and the telescopic heat return tube are retracted;
   the mounting frame comprises a support rod on a side of the mounting frame adjacent to the cold source distributor;
   the support rod comprises a coiler;
   the telescopic cold source tube and the telescopic heat return tube are coiled on the coiler;
   when the telescopic cold source tube and the telescopic heat return tube are pulled by the at least one liquid reservoir to extend, the coiler rotates around the support rod along a first direction;
   when the telescopic cold source tube and the telescopic heat return tube are pushed by the at least one liquid reservoir to retract, the coiler rotates around the support rod along a second direction opposite to the first direction.

2. The liquid immersion cooling device of claim 1, wherein:
   the cold source distributor further comprises a heat exchanger;
   the telescopic cold source tube and the telescopic heat return tube are coupled to the heat exchanger.

3. The liquid immersion cooling device of claim 2, wherein:
   a plurality of liquid reservoirs are stacked within the mounting frame;
   each of the plurality of liquid reservoirs is configure to mount a server;
   the cold source distributor comprises a plurality of heat exchangers;
   the telescopic cold source tube and the telescopic heat return tube connected to the plurality of liquid reservoirs in which the servers mounted therein have powers within a predetermined range are connected to a same heat exchanger.

4. The liquid immersion cooling device of claim 1, wherein:
   the coiler is rotationally mounted on the support rod, and the cold source tube and the heat return tube are coiled on the coiler.

5. The liquid immersion cooling device of claim 1, wherein:
a size of the liquid reservoir matches a size of a server.

6. The liquid immersion cooling device of claim 1 further comprising a sliding block, wherein:
the sliding block is between the liquid reservoir and the mounting frame; and
the sliding block slidably mounts the liquid reservoir to the mounting frame.

7. The liquid immersion cooling device of claim 1, wherein:
a first adapter is mounted to a first sidewall of the liquid reservoir;
the first adapter passes through the first sidewall;
the first adapter on an inner side of the first sidewall is coupled to a server placed within the liquid reservoir;
the first adapter on an outer side of the first sidewall is coupled to an external power line to provide power to the server.

8. The liquid immersion cooling device of claim 1, wherein:
a second adapter is mounted to a second sidewall of the liquid reservoir;
the second adapter passes through the second sidewall;
the second adapter on an inner side of the second sidewall is coupled to a server placed within the liquid reservoir;
the second adapter on an outer side of the second sidewall is coupled to a network line to provide network access to the server.

9. The liquid immersion cooling device of claim 8, wherein:
a latching portion is mounted on opposite sides of the second sidewall;
the mounting frame comprises a projection;
the latching portion and the projection mount the liquid reservoir to the mounting frame.

10. A liquid immersion cooling device comprising:
a mounting frame;
a plurality of liquid reservoirs mounted to the mounting frame; and
a cold source distributor mounted on an outer side of the mounting frame; wherein:
each of the plurality of liquid reservoirs is configured to immerse a server in insulating coolant;
each of the plurality of liquid reservoirs is movably mounted to the mounting frame;
the cold source distributor comprises a plurality of telescopic cold source tubes and a plurality of telescopic heat return tubes;
each of the plurality of liquid reservoirs is coupled to an output end of a corresponding one of the telescopic cold source tubes and an output end of a corresponding one of the telescopic heat return tubes;
when the plurality of liquid reservoirs are pulled out of the mounting frame, the cold source tubes and the heat return tubes are extended by the liquid reservoirs to a predetermined length;
when the plurality of liquid reservoirs are pushed into the mounting frame, the telescopic cold source tubes and the telescopic heat return tubes are retracted;
the mounting frame comprises a support rod on a side of the mounting frame adjacent to the cold source distributor;
the support rod comprises a coder;
the telescopic cold source tubes and the telescopic heat return tubes are wound on the coiler;
when the telescopic cold source tubes and the telescopic heat return tubes are pulled by the liquid reservoirs to extend, the coiler rotates along a first direction around the support rod;
when the telescopic cold source tubes and the telescopic heat return tubes are pushed by the liquid reservoirs to retract, the coiler rotates along a second direction around the support rod.

11. The liquid immersion cooling device of claim 10, wherein:
the cold source distributor further comprises a heat exchanger;
the telescopic cold source tubes and the telescopic heat return tubes are coupled to the heat exchanger.

12. The liquid immersion cooling device of claim 11, wherein:
the cold source distributor comprises a plurality of heat exchangers;
the telescopic cold source tubes and the telescopic heat return tubes connected to the liquid reservoirs in which the servers mounted therein have a power within a predetermined range are connected to the same heat exchanger.

13. The liquid immersion cooling device of claim 10, wherein:
the coiler is directly rotationally mounted on the support rod, and
the telescopic cold source tubes and the telescopic heat return tubes are wound on the coiler.

14. The liquid immersion cooling device of claim 10, wherein:
a size of each of the plurality of liquid reservoirs matches a size of the server.

15. The liquid immersion cooling device of claim 10 further comprising a sliding block, wherein:
the sliding block is between the liquid reservoirs and the mounting frame; and
the sliding block slidably mounts the liquid reservoirs to the mounting frame.

16. The liquid immersion cooling device of claim 10, wherein:
a first adapter is mounted to a first sidewall of each of the liquid reservoirs;
the first adapter passes through the first sidewall;
the first adapter on an inner side of the first sidewall is coupled to the server immersed in a corresponding one of the liquid reservoirs;
the first adapter on an outer side of the first sidewall is coupled to an external power line to provide power to the server.

17. The liquid immersion cooling device of claim 10, wherein:
a second adapter is mounted to a second sidewall of each of the liquid reservoirs;
the second adapter passes through the second sidewall;
the second adapter on an inner side of the second sidewall is coupled to the server immersed in a corresponding one the liquid reservoirs;
the second adapter on an outer side of the second sidewall is coupled to a network line to provide network access to the server.

18. The liquid immersion cooling device of claim 17, wherein:
- a latching portion is mounted on opposite sides of the second sidewall;
- the mounting frame comprises a projection;
- the latching portion and the projection mount each of the liquid reservoirs to the mounting frame.

* * * * *